(12) United States Patent
Yamamoto (10) Patent No.: US 9,013,894 B2
(45) Date of Patent: Apr. 21, 2015

(54) PRINTED CIRCUIT BOARD AND METHOD FOR MANUFACTURING THE SAME

(71) Applicant: Fujitsu Component Limited, Tokyo (JP)

(72) Inventor: Shinya Yamamoto, Tokyo (JP)

(73) Assignee: Fujitsu Component Limited, Tokyo (JP)

( * ) Notice: Subject to any disclaimer, the term of this patent is extended or adjusted under 35 U.S.C. 154(b) by 7 days.

(21) Appl. No.: 14/022,611

(22) Filed: Sep. 10, 2013

(65) Prior Publication Data

US 2014/0076623 A1    Mar. 20, 2014

(30) Foreign Application Priority Data

Sep. 14, 2012    (JP) ................................. 2012-202966

(51) Int. Cl.
| | | |
|---|---|---|
| *H05K 7/00* | (2006.01) | |
| *H05K 1/09* | (2006.01) | |
| *H05K 1/00* | (2006.01) | |
| *H05K 1/16* | (2006.01) | |
| *H05K 1/11* | (2006.01) | |
| *H05K 7/10* | (2006.01) | |
| *H05K 3/42* | (2006.01) | |
| *H05K 3/40* | (2006.01) | |

(Continued)

(52) U.S. Cl.
CPC .................. *H05K 1/116* (2013.01); *H05K 3/42* (2013.01); *H05K 1/113* (2013.01); *H05K 3/3436* (2013.01); *H05K 3/3452* (2013.01); *H05K 3/38* (2013.01); *H05K 3/4007* (2013.01); *H05K 2201/099* (2013.01)

(58) Field of Classification Search
USPC .......... 174/255, 260, 262–266; 361/760, 767, 361/777
See application file for complete search history.

(56) References Cited

U.S. PATENT DOCUMENTS

| | | | |
|---|---|---|---|
| 6,448,504 B1 * | 9/2002 | Taguchi | 174/255 |
| 2008/0314633 A1 | 12/2008 | Kang et al. | |

(Continued)

FOREIGN PATENT DOCUMENTS

| | | |
|---|---|---|
| JP | 2001-230513 | 8/2001 |
| JP | 2001-251042 | 9/2001 |

(Continued)

OTHER PUBLICATIONS

Patent Abstracts of Japan, Publication No. 2001-230513, Published Aug. 24, 2001.

(Continued)

*Primary Examiner* — Timothy Thompson
*Assistant Examiner* — Sherman Ng
(74) *Attorney, Agent, or Firm* — Staas & Halsey LLP (57) ABSTRACT

A printed circuit board includes: a substrate; a land that is disposed on a surface of the substrate, and includes a central portion and a plurality of extended portions, the central portion having the same shape and the same size as a land of a surface mount device, and the extended portions being up-and-down symmetry and right-and-left symmetry with respect to a straight line which passes through the center of the central portion; gaps that are disposed on the surface of the substrate, each of the gaps being disposed on a periphery of the central portion and between the extended portions; and a resist that is disposed on the surface of the substrate, and has an opening portion formed at a position corresponding to the central portion and the gaps.

4 Claims, 10 Drawing Sheets

(51) Int. Cl.
*H05K 3/34* (2006.01)
*H05K 3/38* (2006.01)

(56) References Cited

U.S. PATENT DOCUMENTS

2010/0181102 A1* 7/2010 Abe et al. .................. 174/260
2011/0031004 A1* 2/2011 Yugami et al. ............. 174/260

FOREIGN PATENT DOCUMENTS

| JP | 2002-299807 | 10/2002 |
| JP | 2009-4744 | 1/2009 |
| JP | 2009-239240 | 10/2009 |
| JP | 2011-238662 | 11/2011 |

OTHER PUBLICATIONS

Patent Abstracts of Japan, Publication No, 2001-251042, Published Sep. 14, 2001.
Patent Abstracts of Japan, Publication No. 2002-299807, Published Oct. 11, 2002.
Patent Abstracts of Japan, Publication No. 2009-239240, Published Oct. 15, 2009.
Patent Abstracts of Japan, Publication No. 2011-238662, Published Nov. 24, 2011.
Patent Abstracts of Japan, Publication No. 2009-004744, Published Jan. 8, 2009.

* cited by examiner

PRINTED CIRCUIT BOARD AND METHOD FOR MANUFACTURING THE SAME

CROSS-REFERENCE TO RELATED APPLICATION

This application is based upon and claims the benefit of priority of the prior Japanese Patent Application No. 2012-202966 filed on Sep. 14, 2012, the entire contents of which are incorporated herein by reference.

FIELD

A certain aspect of the embodiments is related to a printed circuit board and a method for manufacturing the same.

BACKGROUND

Conventionally, there have been known a non-over resist structure and an over resist structure as the structure of a printed circuit board when a surface mount device of a BGA (Ball Grid Array) type or a LGA (Land Grid Array) type is mounted on the printed circuit board through a solder.

In the non-over resist structure, a gap is formed between a land and a resist. The solder joins the side surface of the land, and the junction between the solder and the land becomes reliable. However, it is easy to cause a destruction mode in which the land exfoliates from a substrate. On the contrary, in the over resist structure, the land is stopped by the resist, so that the land does not exfoliate from the substrate. However, a junction portion between the land and the solder is only a surface of the land, so that it is easy to cause a destruction mode in which the solder exfoliates from the surface of the land.

Therefore, there is known a printed circuit board in which the non-over resist structure and the over resist structure are mixed (e.g. see Japanese Laid-open Patent Publication No. 2001-230513 (hereinafter referred to as "Patent Document 1"), and Japanese Laid-open Patent Publication No. 2002-299807 (hereinafter referred to as "Patent Document 2")).

SUMMARY

According to an aspect of the present invention, there is provided a printed circuit board including: a substrate; a land that is disposed on a surface of the substrate, and includes a central portion and a plurality of extended portions, the central portion having the same shape and the same size as a land of a surface mount device, and the extended portions being up-and-down symmetry and right-and-left symmetry with respect to a straight line which passes through the center of the central portion; gaps that are disposed on the surface of the substrate, each of the gaps being disposed on a periphery of the central portion and between the extended portions; and a resist that is disposed on the surface of the substrate, and has an opening portion formed at a position corresponding to the central portion and the gaps.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

As described previously, when the surface mount device of the BGA (Ball Grid Array) type or the LGA (Land Grid Array) type which does not form a solder fillet is connected to the printed circuit board through the solder, it is desirable that the land of the printed circuit board has the same shape and size as the land of the surface mount device. This is because when any one of the lands of the printed circuit board and the surface mount device is smaller than another one, the small land exfoliates from the substrate or a lower surface of the surface mount device, or the solder exfoliates from the small land. There is a problem that the junction reliability of the solder and the land and the junction reliability of the land and the substrate are weak.

In many cases, the shape of the land of the surface mount device is a round or a square. However, in the technique of the Patent Document 1 and the Patent Document 2, the shape of the land of the printed circuit board is not the round or the square, and hence any one of the lands of the printed circuit board and the surface mount device is smaller than another one. As a result, the problem that the junction reliability between the solder and the land and the junction reliability between the land and the substrate are weak arises.

Hereinafter, a description will be given of embodiments of the present invention with reference to the drawings.

First Embodiment

Figure 1A:
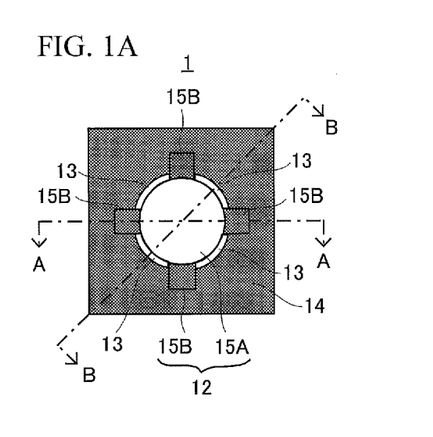
FIG. 1A is a schematic diagram illustrating the configuration of a printed circuit board according to a first embodiment.
Figure 1B:
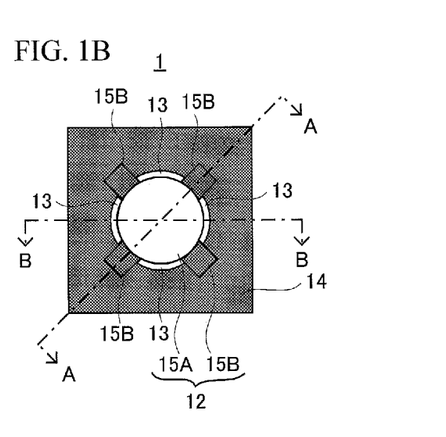
FIGS. 1B to 1D are diagrams illustrating variation examples of the printed circuit board.
Figure 1C:
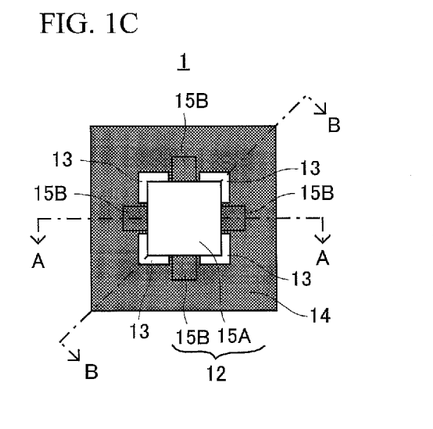
Figure 1D:
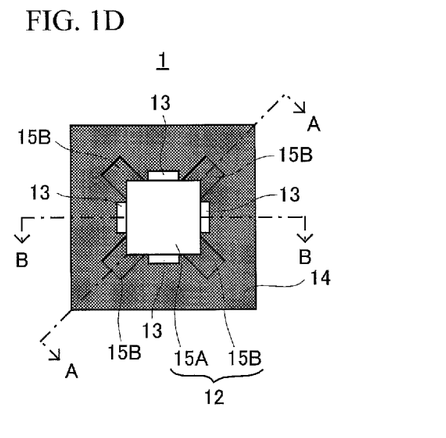
Figure 2A:
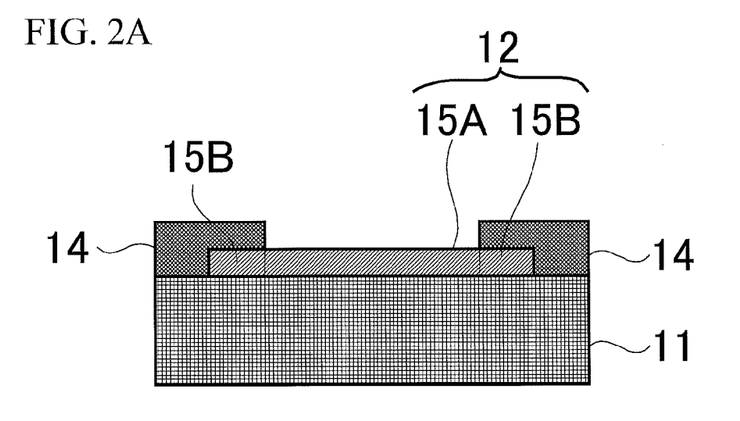
FIG. 2A is a cross-section diagram of the printed circuit board taken along a line A-A in FIGS. 1A to 1D.
Figure 2B:
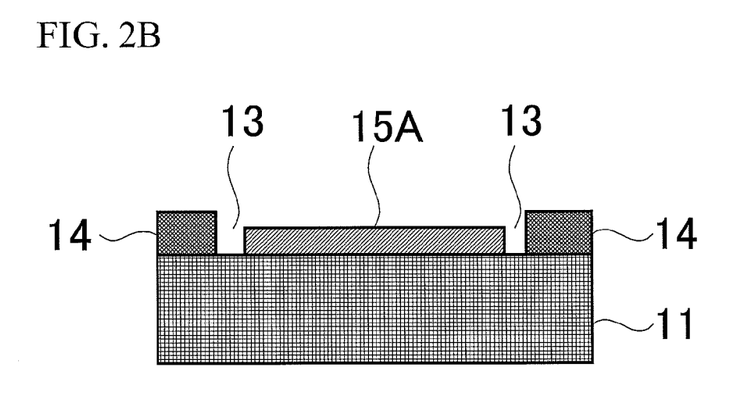
FIG. 2B is a cross-section diagram of the printed circuit board taken along a line B-B in FIGS. 1A to 1D.
Figure 3A:
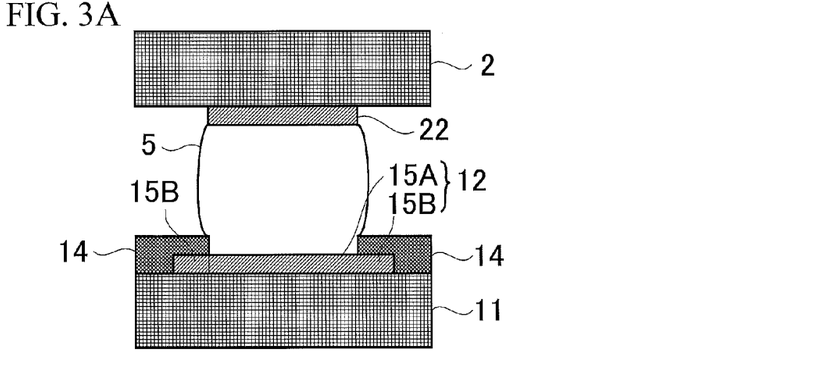
FIG. 3A is a cross-section diagram of the printed circuit board corresponding to FIG. 2A and a surface mount device.
Figure 3B:
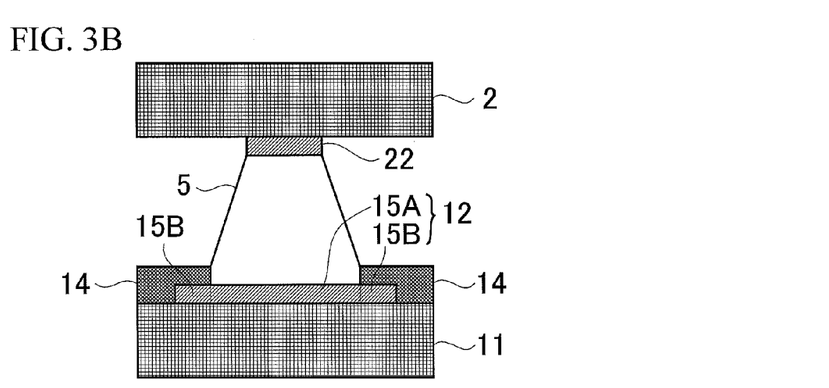
FIGS. 3B and 3C are cross-section diagrams of the printed circuit board and the surface mount device when the land of the surface mount device has a different shape or different size from the land of the printed circuit board.
Figure 3C:
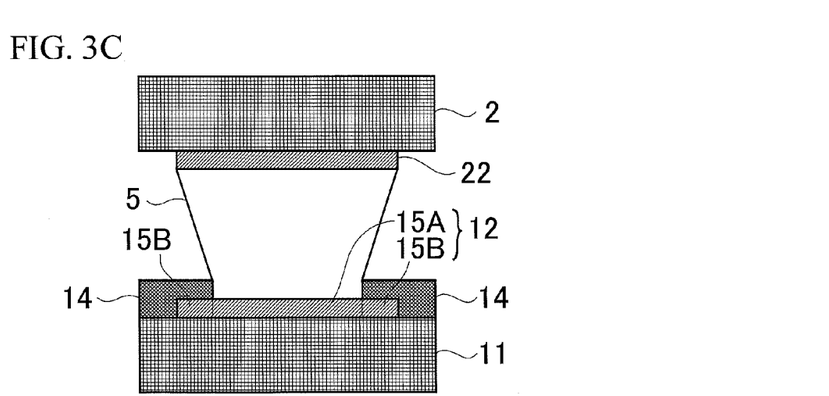

FIG. 1A is a schematic diagram illustrating the configuration of a printed circuit board according to a first embodiment. FIGS. 1B to 1D are diagrams illustrating variation examples of the printed circuit board. FIG. 2A is a cross-section diagram of the printed circuit board taken along a line A-A in FIGS. 1A to 1D. FIG. 2B is a cross-section diagram of the printed circuit board taken along a line B-B in FIGS. 1A to 1D. FIG. 3A is a cross-section diagram of the printed circuit board corresponding to FIG. 2A and a surface mount device. FIGS. 3B and 3C are cross-section diagrams of the printed circuit board and the surface mount device when the land of the surface mount device has a different shape or different size from the land of the printed circuit board.

The printed circuit board 1 has an insulating substrate 11, such as an epoxy resin, a land 12 disposed on the substrate 11, and a resist 14 disposed on the substrate 11. As illustrated in FIG. 3A, the land 12 is a conductor electrically connected to the surface mount device 2 through a solder 5. Also, the land 12 is connected to wirings, not shown, on the substrate 11.

As illustrated in FIGS. 1A to 1D, the land 12 has a central portion 15A and four extended portions 15B. That is, in the land 12, the central portion 15A is integrally formed with the four extended portions 15B. The central portion 15A of the land 12 is a round or a square, as viewed from above. However, the shape of the central portion 15A of the land 12 is not limited to these, but may be a rectangle, a rhombus, a regular 2n-sided polygon (n is a natural number equal to or more than 2), or the like. The four extended portions 15B are disposed on the left, the right, the top and the bottom of the central portion 15A, or the lower right, the upper right, the lower left and the upper left of the land 12. The extended portions 15B are covered with the resist 14. Each of gaps 13 is disposed on a periphery of the central portion 15A and between the respective extended portions 15B. Therefore, in the case of FIGS. 1A and 1B, the circular central portion 15A and the four gaps 13 are exposed without being covered with the resist 14. In the case of FIGS. 1C and 1D, the square central portion 15A and the four gaps 13 are exposed without being covered with the resist 14. In FIGS. 1A to 1D, hatching is given to a portion covered with the resist 14.

In the printed circuit board 1, a non-over resist structure and an over resist structure are mixed. The non-over resist structure is a structure in which the gaps 13 are disposed between the land 12 and the resist 14, and is a structure corresponding to a cross-section surface of FIG. 2B. In this case, since the solder 5 goes into the gaps 13 and is firmly fixed to a side surface of the central portion 15A of the land 12, the junction reliability between the solder 5 and the land 12 improves. The over resist structure is a structure in which the outer peripheral end of the land 12 is covered with the resist 14, and is a structure corresponding to a cross-section surface of FIG. 2A. In this case, since the extended portions 15B of the land 12 are covered with the resist 14, the junction reliability between the land 12 and the substrate 11 improves.

The surface mount device 2 is a surface mount device of the BGA (Ball Grid Array) type or the LGA (Land Grid Array) type which does not form a solder fillet. As illustrated in FIG. 3A, a land 22 is formed on a lower surface of the surface mount device 2. The land 22 has the same shape and the same size as the round or square central portion 15A, and is connected to the central portion 15A of the land 12 via the solder 5. Since the land 22 and the central portion 15A of the land 12 have the same shape and the same size as each other, the intensity of the junction between the land 22 and the central portion 15A of the land 12 by the solder 5 increases. For example, when any one of the land 22 and the land 12 is smaller than another one, as illustrated in FIGS. 3B and 3C, there is a problem that the small land exfoliates from the substrate 11 or the lower surface of the surface mount device 2, or the solder 5 exfoliates from the small land, and hence the junction reliability is weak. However, when the land 22 and the central portion 15A of the land 12 have the same shape and the same size as each other, as illustrated in FIG. 3A, the exfoliation does not occur and therefore the junction reliability between the land 22 and the land 12 improves. Since the shape and the size of the land 22 can be reflected in the design of the land 12, man-hour and a manufacturing cost can be held down.

Next, a description will be given of manufacturing procedures of the printed circuit board 1 of FIG. 1A with reference to FIGS. 4A to 4G. Here, manufacturing procedures of the printed circuit board 1 of FIGS. 1B to 1D are the same as the manufacturing procedures of the printed circuit board 1 of FIG. 1A. The printed circuit board 1 is manufactured by using a well-known printed circuit board manufacturing device.

Figure 4A:
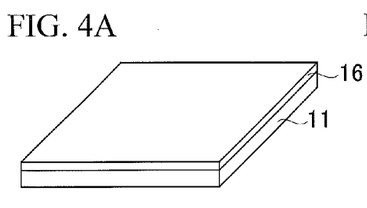
FIGS. 4A to 4G is a diagram illustrating manufacturing procedures of the printed circuit board.
Figure 4B:
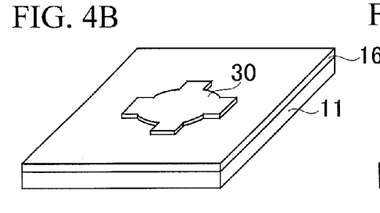
Figure 4C:
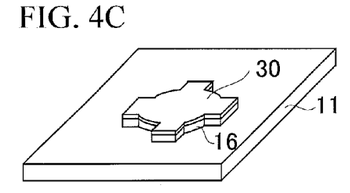
Figure 4D:
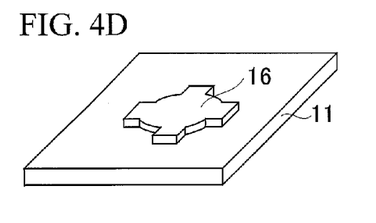

First, as an initial state, a formation process for forming the land 12 is performed in a state where a copper foil 16 is joined to the surface of the substrate 11 (FIG. 4A). Specifically, the printed circuit board manufacturing device applies an etching resist 30 having a predetermined pattern (here, a pattern corresponding to the central portion 15A and the four extended portions 15B) to the surface of the copper foil 16 by a well-known photo method (FIG. 4B). Then, the printed circuit board manufacturing device removes a redundant portion of the copper foil 16 by etching (FIG. 4C), and further removes the etching resist 30 (FIG. 4D). Thereby, the central portion 15A and the four extended portions 15B are formed on the surface of the substrate 11.

Figure 4E:
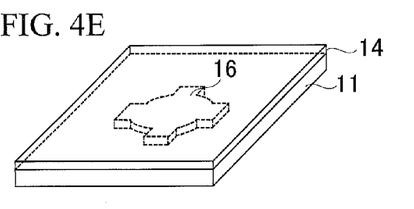

Next, the printed circuit board manufacturing device performs a resist application process which applies the unhardened resist 14 to the whole surface of the substrate 11 (FIG. 4E). In the present embodiment, a photosensitive resist is employed as the resist 14.

Figure 4F:
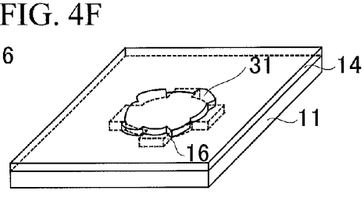
Figure 4G:
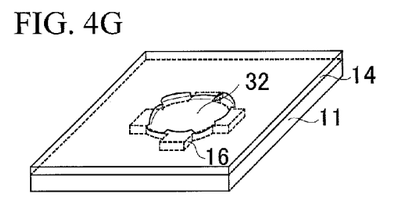

The printed circuit board manufacturing device performs an opening process in which a portion of the resist 14 corresponding to the central portion 15A and the four gaps 13 is opened, and the central portion 15A is exposed. In the opening process, the printed circuit board manufacturing device disposes a photomask film 31 on the central portion 15A and the four gaps 13, and exposes the resist 14 (FIG. 4F). Thereby, a portion of the applied resist 14 which is not covered with the photomask film 31 is hardened. Then, the printed circuit board manufacturing device exfoliates the photomask film 31, and removes an unhardened portion of the resist 14 by etching (FIG. 4G). Thereby, an opening portion 32 is formed at a position corresponding to the central portion 15A and the four gaps 13.

By the procedures described above, the printed circuit board 1 in which the non-over resist structure and the over resist structure are mixed is manufactured.

Figure 5A:
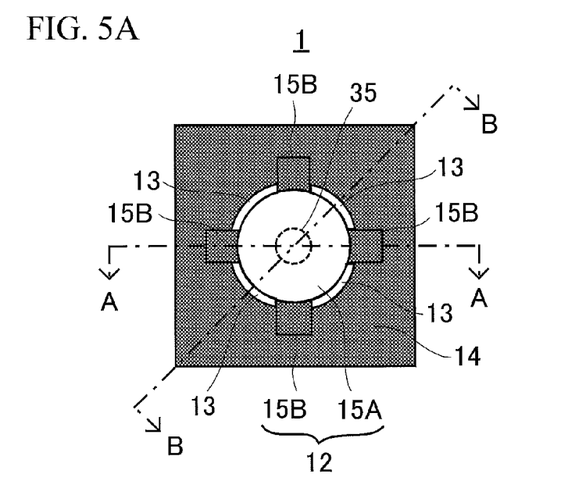
FIG. 5A is a plain diagram illustrating a first variation example of the printed circuit board of FIG. 1A.
Figure 5B:
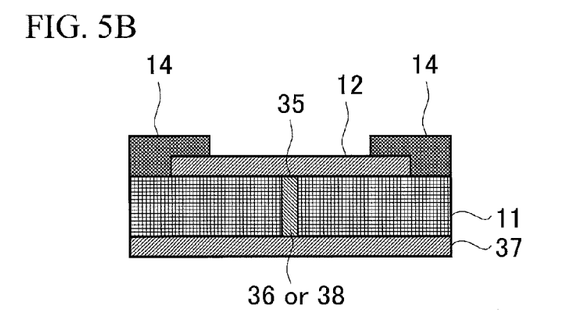
FIG. 5B is a cross-section diagram of the printed circuit board taken along a line A-A of FIG. 5A.
Figure 5C:
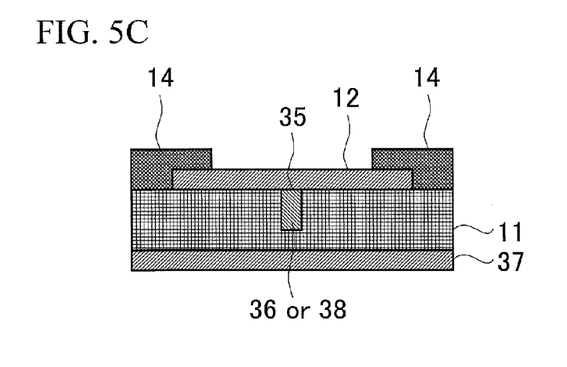
FIG. 5C is a variation example of the cross-section diagram of the printed circuit board taken along the line A-A of FIG. 5A.

FIG. 5A is a plain diagram illustrating a first variation example of the printed circuit board 1 of FIG. 1A. FIG. 5B is a cross-section diagram of the printed circuit board 1 taken along a line A-A of FIG. 5A. FIG. 5C is a variation example of the cross-section diagram of the printed circuit board 1 taken along the line A-A of FIG. 5A. Here, a first variation example of the printed circuit board 1 of FIG. 1A is explained, but the printed circuit boards 1 of FIGS. 1B to 1D can be varied like the printed circuit board 1 of FIG. 1A.

For example, at least one via hole 35 is provided under the land 12, as illustrated in FIG. 5B. The via hole 35 may be provided under the central portion 15A, or may be provided below at least one of the four extended portions 15B.

Then, the via hole 35 is filled up with a conductor 36, such as a copper, and the land 12 is physically connected to a circuit 37 included in an inner layer of the substrate 11, through the conductor 36. In this case, the land 12 is physically connected to the circuit 37 included in the inner layer of the substrate 11, through the conductor 36, so that an upward tensile strength of the land 12 increases and the junction reliability between the land 12 and the substrate 11 improves.

When the land 12 is not electrically connected to the circuit 37, an insulator 38 may be used instead of the conductor 36. That is, the land 12 may be connected to the circuit 37 via the insulator 38. A component used in order to fill up the via hole 35 is the conductor 36 or the insulator 38.

As illustrated in FIG. 5C, the conductor 36 or the insulator 38 to be connected to the land 12 may be embedded in the inner layer of the substrate 11, and does not necessarily need to be physically connected to the circuit 37. In this case, the via hole 35 is extended to a predetermined depth inside the substrate 11. Moreover, in this case, the circuit 37 does not need to be included in the inner layer of the substrate 11. According to FIG. 5C, the upward tensile strength of the land 12 increases, and hence the junction reliability between the land 12 and the substrate 11 improves.

In FIGS. 5A to 5C, the number of via holes 35 is not limited to one, and a plurality of via holes 35 may be formed under the land 12. In this case, the plurality of via holes 35 are also filled up with the conductor 36 or the insulator 38. Here, in FIGS. 5A to 5C, the arrangement of the circuit 37, the formation of the via hole 35, and the disposal of the conductor 36 or the insulator 38 are performed before the manufacturing procedures of the printed circuit board 1 of FIGS. 4A to 4G.

Figure 6A:
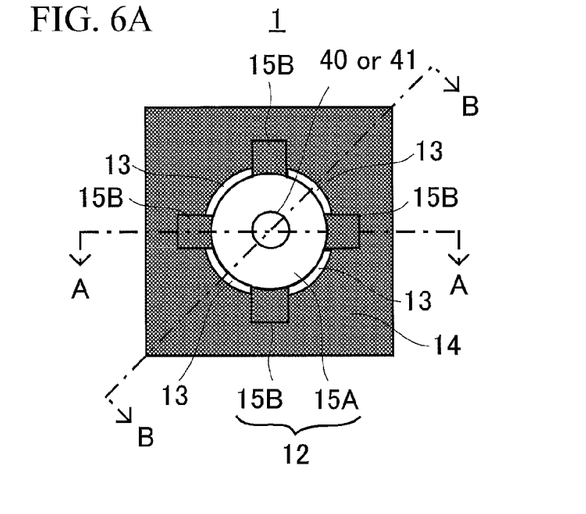
FIG. 6A is a plain diagram illustrating a second variation example of the printed circuit board of FIG. 1A.
Figure 6B:
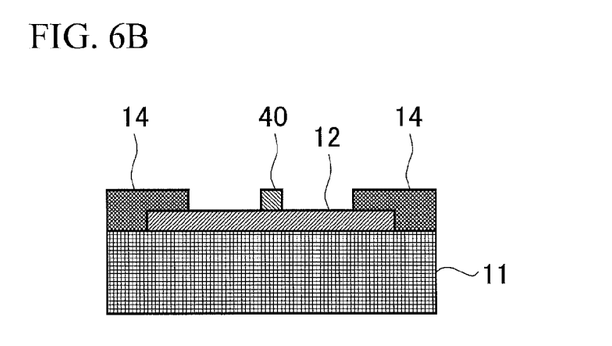
FIG. 6B is a cross-section diagram of the printed circuit board taken along a line A-A of FIG. 6A.
Figure 6C:
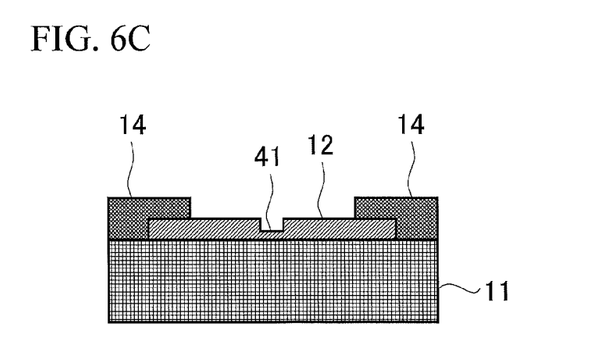
FIG. 6C is a variation example of the cross-section diagram of the printed circuit board taken along the line A-A of FIG. 6A.

FIG. 6A is a plain diagram illustrating a second variation example of the printed circuit board 1 of FIG. 1A. FIG. 6B is a cross-section diagram of the printed circuit board 1 taken along a line A-A of FIG. 6A. FIG. 6C is a variation example of the cross-section diagram of the printed circuit board 1 taken along the line A-A of FIG. 6A. Here, a second variation example of the printed circuit board 1 of FIG. 1A is explained, but the printed circuit boards 1 of FIGS. 1B to 1D can be varied like the printed circuit board 1 of FIG. 1A.

For example, at least one convex portion 40 as a projection portion is provided on the central portion 15A of the land 12, as illustrated in FIG. 6B. Alternatively, at least one concave portion 41 as a recess portion is provided on the central portion 15A of the land 12, as illustrated in FIG. 6C. The convex portion 40 is formed by copper plating, for example. The concave portion 41 is formed by removing a part of the land 12 by etching. The combination of the convex portion 40 and the concave portion 41 may be formed on the land 12.

Thus, at least one convex portion 40 and/or at least one concave portion 41 are provided on the central portion 15A of the land 12. Thereby, a contact area of the solder 5 to the central portion 15A of the land 12 increases, and hence the junction reliability between the land 12 and the solder 5 improves.

Here, the composition of the printed circuit board 1 of FIG. 5B or 5C and the composition of the printed circuit board 1 of FIG. 6B or 6C may be combined arbitrarily.

As described above, according to the present embodiment, the printed circuit board 1 includes: the substrate 11; the land 12 that is disposed on the surface of the substrate 11, and includes the central portion 15A and the plurality of extended portions 15B, the central portion 15A having the same shape and the same size as the land 22 of the surface mount device 2, and the extended portions 15B being up-and-down symmetry and right-and-left symmetry with respect to a straight line which passes through the center of the central portion 15A; the gaps 13 that are disposed on the surface of the substrate 11, each of the gaps 13 being disposed on a periphery of the central portion 15A and between the respective extended portions 15B; and the resist 14 that is disposed on the surface of the substrate 11, and has an opening portion 32 formed at a position corresponding to the central portion 15A and the gaps 13.

Therefore, in the printed circuit board 1, the non-over resist structure and the over resist structure are mixed, and the land 22 and the central portion 15A of the land 12 have the same shape and the same size as each other. Accordingly, the junction reliability between the solder 5 and the land 12 and the junction reliability between the land 12 and the substrate 11 improve.

Second Embodiment

In the printed circuit board 1 of the first embodiment, the non-over resist structure and the over resist structure are mixed. In a second embodiment, the printed circuit board 1 has an innovative over resist structure.

Figure 7A:
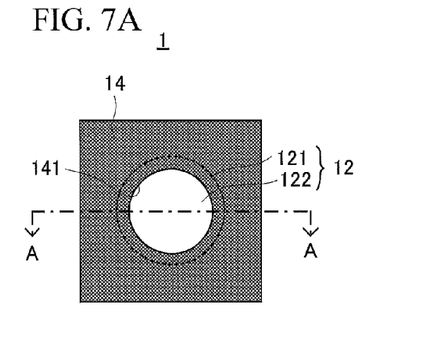
FIG. 7A is a schematic diagram illustrating the configuration of the printed circuit board according to a second embodiment.
Figure 7B:
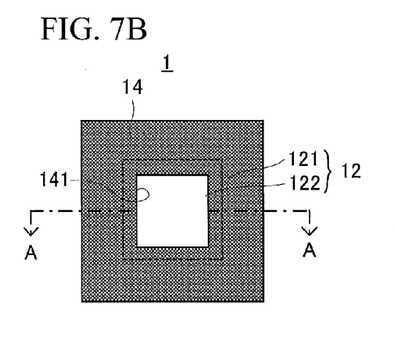
FIG. 7B is a diagram illustrating a variation example of the printed circuit board of FIG. 7A.
Figure 7C:
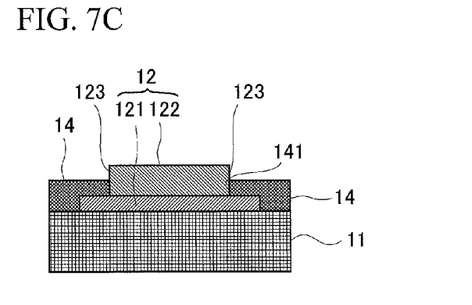
FIG. 7C is a cross-section diagram of the printed circuit board taken along the line A-A of FIG. 7A or 7B.
Figure 7D:
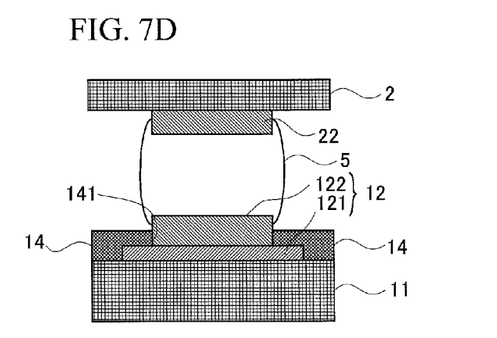
FIG. 7D is a cross-section diagram of the printed circuit board corresponding to FIG. 7A or 7B and the surface mount device.

FIG. 7A is a schematic diagram illustrating the configuration of the printed circuit board 1 according to the second embodiment. FIG. 7B is a diagram illustrating a variation example of the printed circuit board 1. FIG. 7C is a cross-section diagram of the printed circuit board 1 taken along the line A-A of FIG. 7A or 7B. FIG. 7D is a cross-section diagram of the printed circuit board 1 corresponding to FIG. 7A or 7B and the surface mount device 2.

As is clear from FIGS. 7A to 7C, a cross-section surface of the land 12 of the printed circuit board 1 is a convex shape, and the land 12 of the printed circuit board 1 is formed so as to have two or more steps of structures. That is, the land 12 has a first land 121 and a second land 122. The size or the bore diameter of the second land 122 is smaller than the size or the bore diameter of the first land 121. In the case of FIG. 7B, the size or a length of one side of the second land 122 is smaller than the size or the length of one side of the first land 121. The second land 122 is formed on an upper surface of the first land 121. The resist 14 covers a periphery portion of the first land 121, and a portion on which the first land 121 and the second land 122 are disposed. The resist 14 has an opening portion 141 at a position corresponding to the second land 122. The second land 122 is formed so as to become higher than the upper surface of the resist 14, i.e., to project from the upper surface of the resist 14. Thereby, the solder 5 can be joined to a side surface 123 of the second land 122, and the junction reliability between the second land 122 and the solder 5 improves compared with the case where the solder 5 is joined to the surface of the second land 122. Further, since the land 121 is covered with the resist 14, the junction reliability between the first land 121 and the substrate 11 also improves. Therefore, in the printed circuit board 1 of the second embodiment, the non-over resist structure is achieved by the second land 122 and the over resist structure is achieved by the first land 121.

As illustrated in FIG. 7D, the second land 122 has the same shape and size as the land 22 of the surface mount device 2, and is connected to the land 22 via the solder 5. Since the land 22 and the second land 122 have the same shape and size as each other, the intensity of the junction between the land 22 and the second land 122 by the solder 5 increases.

Here, a description will be given of a method for manufacturing the second land 122, with reference to FIGS. 8A to 8C. As the method for manufacturing the second land 122, there are (1) a method for manufacturing the second land 122 by plating growth, (2) a method for manufacturing the second land 122 by etching removal, and (3) a method for manufacturing the second land 122 by laser removal. The second land 122 is manufactured by using the well-known printed circuit board manufacturing device.

Figure 8A:
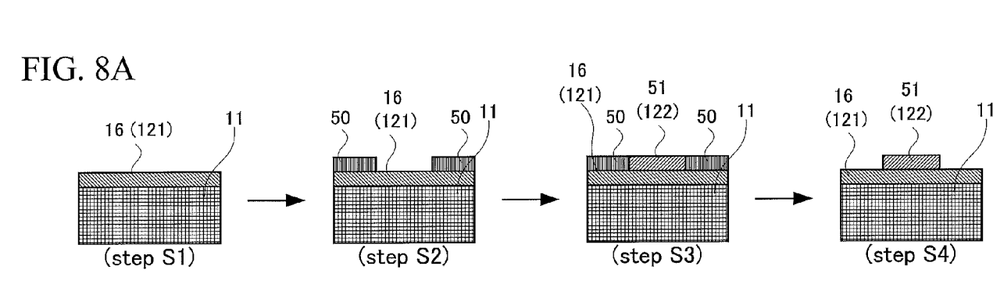
FIGS. 8A to 8C are diagrams illustrating a manufacturing method of a second land.

In the method for manufacturing the second land 122 by plating growth of FIG. 8A, the copper foil 16 is joined to the surface of the substrate 11, as an initial state (step S1). Here, the copper foil 16 corresponds to the first land 121.

A method for manufacturing the first land 121 is the same as the method illustrated in FIGS. 4A to 4D. That is, the printed circuit board manufacturing device applies the etching resist 30 having a predetermined pattern (here, a pattern corresponding to the first land 121) to the surface of the copper foil 16 by the well-known photo method. Then, the printed circuit board manufacturing device removes a redundant portion of the copper foil 16 by etching, and further removes the etching resist 30. Thereby, the first land 121 is formed on the surface of the substrate 11.

Next, the printed circuit board manufacturing device bakes a photomask film 50 onto a domain on the copper foil 16 other than a domain on which the second land 122 is formed (step S2). The printed circuit board manufacturing device grows the copper plating 51 on the domain on which the second land 122 is formed until the copper plating 51 becomes a predetermined thickness (step S3). The predetermined thickness corresponds to the height of the second land 122 when the second land 122 projects from the upper surface of the resist 14. Then, the photomask film 50 is removed (step S4). Thereby, the copper plating 51 as the second land 122 is formed on the copper foil 16 as the first land 121.

Figure 8B:
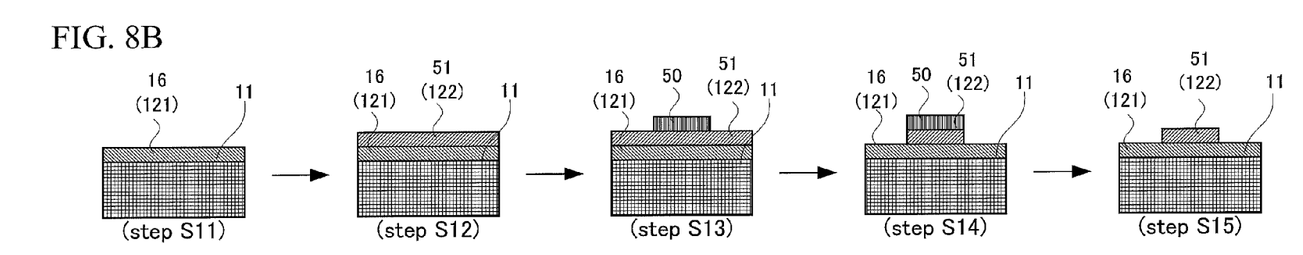

In the method for manufacturing the second land 122 by etching removal of FIG. 8B, the copper foil 16 is joined to the surface of the substrate 11, as an initial state (step S11). Here, the copper foil 16 corresponds to the first land 121. Next, the printed circuit board manufacturing device deposits the copper plating 51 having a predetermined thickness on the copper foil 16 (step S12). The predetermined thickness corresponds to the height of the second land 122 when the second land 122 projects from the upper surface of the resist 14. The printed circuit board manufacturing device bakes the photomask film 50 onto a domain on which the second land 122 is formed (step S13). Then, the printed circuit board manufacturing device removes a portion of the copper plating 51 on which the photomask film 50 is not baked, by etching (step S14). Then, the photomask film 50 is removed (step S15). Thereby, the copper plating 51 as the second land 122 is formed on the copper foil 16 as the first land 121.

Figure 8C:
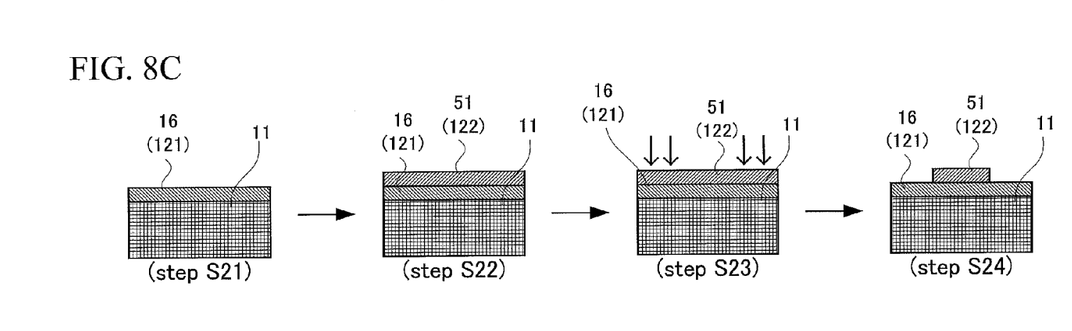

In the method for manufacturing the second land 122 by laser removal of FIG. 8C, the copper foil 16 is joined to the surface of the substrate 11, as an initial state (step S21). Here, the copper foil 16 corresponds to the first land 121. Next, the printed circuit board manufacturing device deposits the copper plating 51 having a predetermined thickness on the copper foil 16 (step S22). The printed circuit board manufacturing device irradiates with a laser a domain of the copper plating 51 other than a domain on which the second land 122 is formed, and removes the copper plating 51 corresponding to the irradiated domain (step S23). Then, the waste of the copper plating 51 is removed (step S24). Thereby, the copper plating 51 as the second land 122 is formed on the copper foil 16 as the first land 121.

After any one of the methods for manufacturing the second land 122 is performed, the printed circuit board manufacturing device applies the unhardened resist 14 to the whole surface of the printed circuit board 1, disposes the photomask film 31 onto the second land 122, and exposes the resist 14, as illustrated in FIGS. 4E to 4G. Then, the printed circuit board manufacturing device exfoliates the photomask film 31, and removes an unhardened portion of the resist 14 by etching. Thereby, the printed circuit board 1 having the first land 121 and the second land 122 is formed, as illustrated in FIG. 7C.

Here, the copper foil 16 as the first land 121 and the copper plating 51 as the second land 122 are used, but a conductor other than a copper may be used as the first land 121 and the second land 122.

Figure 9A:
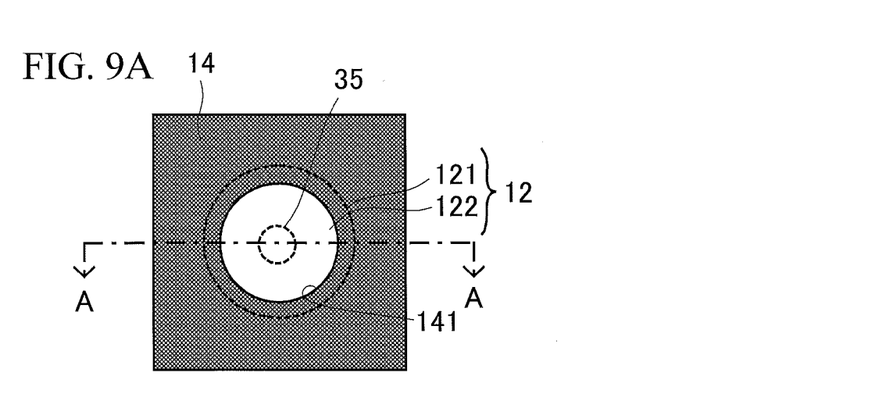
FIG. 9A is a plain diagram illustrating a first variation example of the printed circuit board of FIG. 7A.
Figure 9B:
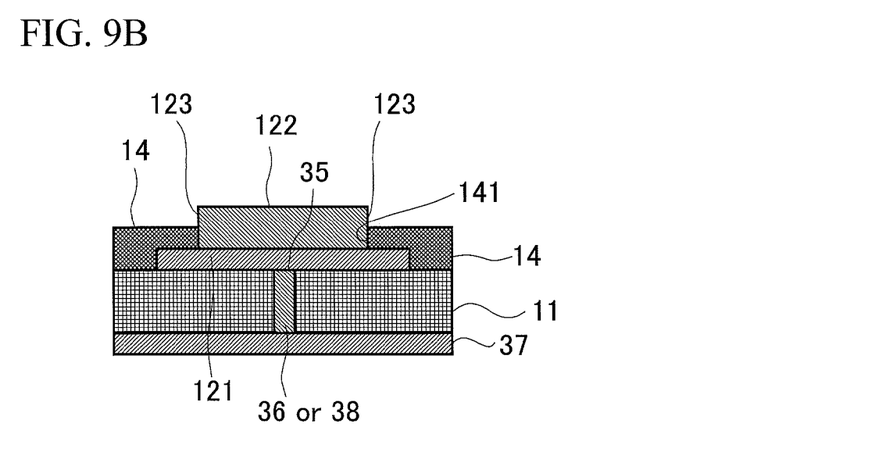
FIG. 9B is a cross-section diagram of the printed circuit board taken along a line A-A of FIG. 9A.
Figure 9C:
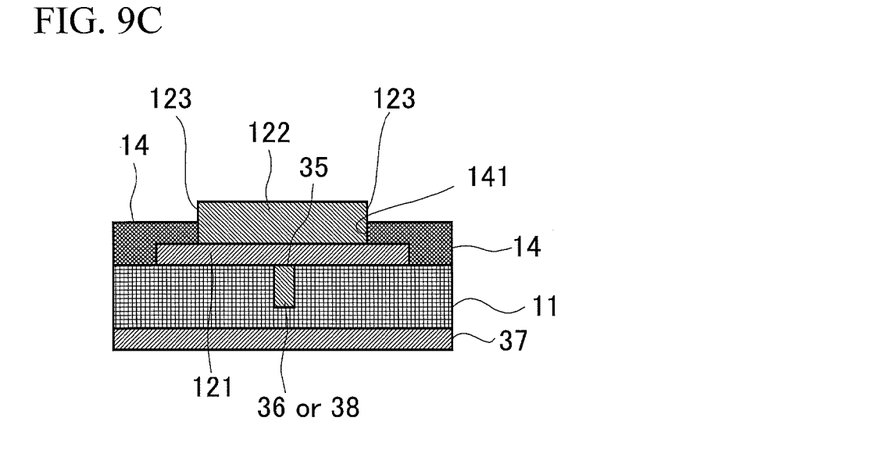
FIG. 9C is a variation example of the cross-section diagram of the printed circuit board taken along the line A-A of FIG. 9A.

FIG. 9A is a plain diagram illustrating a first variation example of the printed circuit board 1 of FIG. 7A. FIG. 9B is a cross-section diagram of the printed circuit board 1 taken along a line A-A of FIG. 9A. FIG. 9C is a variation example of the cross-section diagram of the printed circuit board 1 taken along the line A-A of FIG. 9A. Here, a first variation example of the printed circuit board 1 of FIG. 7A is explained, but the printed circuit board 1 of FIG. 7B can be varied like the printed circuit board 1 of FIG. 7A.

For example, at least one via hole 35 is provided under the first land 121, as illustrated in FIG. 9B. Then, the via hole 35 is filled up with the conductor 36, such as the copper, and the first land 121 is physically connected to the circuit 37 included in the inner layer of the substrate 11, through the conductor 36. In this case, the first land 121 is physically connected to the circuit 37 included in the inner layer of the substrate 11, through the conductor 36, so that an upward tensile strength of the first land 121 and the second land 122 increases and the junction reliability between the first land 121 and the substrate 11 improves.

When the first land 121 is not electrically connected to the circuit 37, the insulator 38 may be used instead of the conductor 36. That is, the first land 121 may be connected to the circuit 37 via the insulator 38.

As illustrated in FIG. 9C, the conductor 36 or the insulator 38 to be connected to the first land 121 may be embedded in the inner layer of the substrate 11, and does not necessarily need to be physically connected to the circuit 37. In this case, the via hole 35 is extended to a predetermined depth inside the substrate 11. Moreover, in this case, the circuit 37 does not need to be included in the inner layer of the substrate 11. According to FIG. 9C, the upward tensile strength of the first land 121 and the second land 122 increases, and hence the junction reliability between the first land 121 and the substrate 11 improves.

In FIGS. 9A to 9C, the number of via holes 35 is not limited to one, and a plurality of via holes 35 may be formed under the first land 121. In this case, the plurality of via holes 35 are also filled up with the conductor 36 or the insulator 38. Here, in FIGS. 9A to 9C, the arrangement of the circuit 37, the formation of the via hole 35, and the disposal of the conductor 36 or the insulator 38 are performed before the first land 121 is formed on the surface of the substrate 11.

Figure 10A:
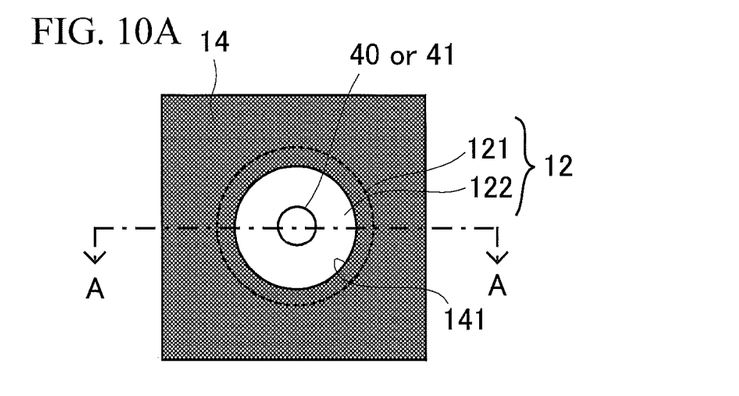
FIG. 10A is a plain diagram illustrating a second variation example of the printed circuit board of FIG. 7A.
Figure 10B:
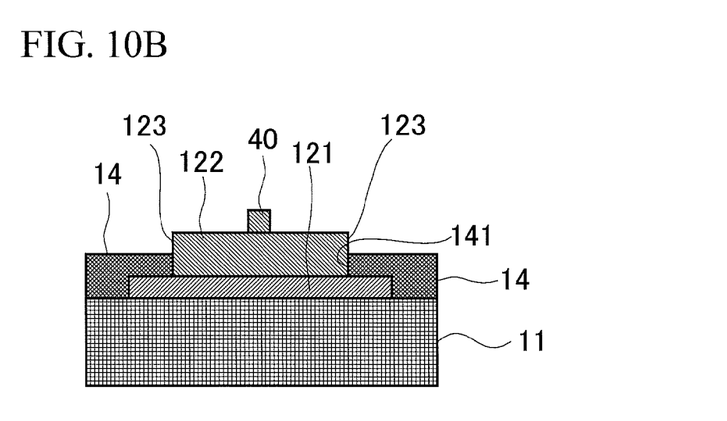
FIG. 10B is a cross-section diagram of the printed circuit board taken along a line A-A of FIG. 10A.
Figure 10C:
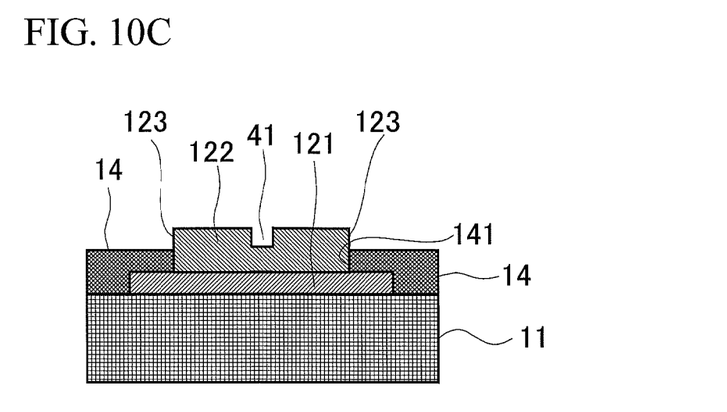
FIG. 10C is a variation example of the cross-section diagram of the printed circuit board taken along the line A-A of FIG. 10A.

FIG. 10A is a plain diagram illustrating a second variation example of the printed circuit board 1 of FIG. 7A. FIG. 10B is a cross-section diagram of the printed circuit board 1 taken along a line A-A of FIG. 10A. FIG. 10C is a variation example of the cross-section diagram of the printed circuit board 1 taken along the line A-A of FIG. 10A. Here, a second variation example of the printed circuit board 1 of FIG. 7A is explained, but the printed circuit board 1 of FIG. 7B can be varied like the printed circuit board 1 of FIG. 7A.

For example, at least one convex portion 40 is provided on the second land 122, as illustrated in FIG. 10B. Alternatively, at least one concave portion 41 is provided on the second land 122, as illustrated in FIG. 10C. The convex portion 40 is formed by the copper plating, for example. The concave portion 41 is formed by removing a part of the second land 122 by etching. The combination of the convex portion 40 and the concave portion 41 may be formed on the second land 122.

Thus, at least one convex portion 40 and/or at least one concave portion 41 are provided on the second land 122. Thereby, a contact area of the solder 5 to the second land 122 increases, and hence the junction reliability between the second land 122 and the solder 5 improves. Here, the composition of the printed circuit board 1 of FIG. 9B or 9C and the composition of the printed circuit board 1 of FIG. 10B or 10C may be combined arbitrarily.

As described above, according to the present embodiment, the printed circuit board 1 includes: the substrate 11; the land 12 that has a first land 121 disposed on the surface of the substrate 11 and a second land 122 disposed on the upper surface of the first land 121, the second land 122 being smaller than the first land 121 and having the same shape and the same size as the land 22 of the surface mount device 2; and the resist 14 that is disposed on the surface of the substrate 11 and has an opening portion 141 formed at a position corresponding to the second land 122; wherein the second land 122 is formed so as to project from the upper surface of the resist 14.

Therefore, in the printed circuit board 1, the non-over resist structure and the over resist structure are mixed. Accordingly, the junction reliability between the solder 5 and the land 12 and the junction reliability between the land 12 and the substrate 11 improve.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A printed circuit board comprising:
    a substrate;
    a land that is disposed on a surface of the substrate, and includes a central portion and a plurality of extended portions, the central portion having the same shape and the same size as a land of a surface mount device, and the extended portions being up-and-down symmetry and right-and-left symmetry with respect to a straight line which passes through the center of the central portion;
    gaps that are disposed on the surface of the substrate, each of the gaps being disposed on a periphery of the central portion and between the extended portions; and
    a resist that is disposed on the surface of the substrate, and has an opening portion formed at a position corresponding to the central portion and the gaps.

2. The printed circuit board as claimed in claim 1, wherein the land is connected to a component used in order to fill up a via hole, the via hole being formed in an inner layer of the substrate.

3. The printed circuit board as claimed in claim 2, wherein the land is connected to a circuit formed in the inner layer of the substrate via the component used in order to fill up the via hole.

4. The printed circuit board as claimed in claim 1, wherein at least one of a projection portion and a recess portion is provided on the land.

* * * * *